(12) United States Patent
Slutzky et al.

(10) Patent No.: US 11,080,452 B2
(45) Date of Patent: Aug. 3, 2021

(54) MULTI AGENT RADIO FREQUENCY PROPAGATION SIMULATOR

(71) Applicant: The United States of America, as represented by the Secretary of the Navy, Crane, IN (US)

(72) Inventors: Barry Slutzky, Williams, IN (US); Patrick Shaffer, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 42 days.

(21) Appl. No.: 16/101,469

(22) Filed: Aug. 12, 2018

(65) Prior Publication Data

US 2018/0365362 A1  Dec. 20, 2018

Related U.S. Application Data

(62) Division of application No. 14/201,011, filed on Mar. 7, 2014, now Pat. No. 10,061,880.

(60) Provisional application No. 61/809,900, filed on Apr. 9, 2013.

(51) Int. Cl.
*G06F 30/367* (2020.01)
(52) U.S. Cl.
CPC .................. *G06F 30/367* (2020.01)
(58) Field of Classification Search
CPC .................................... G06F 30/367

USPC ......................................... 703/13, 2
See application file for complete search history.

(56) References Cited

U.S. PATENT DOCUMENTS

| | | | |
|---|---|---|---|
| 5,117,377 A * | 5/1992 | Finman ................ | G01S 7/4004 333/103 |
| 5,752,167 A | 5/1998 | Kitayoshi | |
| 6,058,261 A * | 5/2000 | Rapeli ................ | H04B 17/0087 703/2 |
| 6,745,374 B2 | 6/2004 | Tekumalla et al. | |
| 7,184,720 B2 | 2/2007 | Poutanen et al. | |
| 7,650,261 B2 | 1/2010 | Takiishi et al. | |
| 7,653,524 B2 | 1/2010 | Li et al. | |
| 8,306,496 B2 | 11/2012 | Shoji et al. | |
| 2008/0161005 A1* | 7/2008 | Sato ................... | H04W 16/225 455/446 |
| 2010/0003991 A1* | 1/2010 | Pao ................... | H04W 16/18 455/446 |
| 2010/0130151 A1* | 5/2010 | Shoji ................... | H04B 17/309 455/226.2 |
| 2014/0222525 A1* | 8/2014 | Heckman, III .... | G06Q 10/0833 705/7.37 |

* cited by examiner

*Primary Examiner* — Juan C Ochoa
(74) *Attorney, Agent, or Firm* — Naval Surface Warfare Center, Crane Division; Christopher A. Monsey

(57) ABSTRACT

A method and apparatus for simulating radio frequency propagation paths between radio frequency devices are provided. In an illustrative embodiment, the apparatus comprising a system controller for receiving and processing test data, a data sequencer configured to interact with attenuators and RF devices, and RF paths designed to simulate RF propagation paths. The method comprising steps to execute a full simulation.

14 Claims, 11 Drawing Sheets

MULTI AGENT RADIO FREQUENCY PROPAGATION SIMULATOR

CROSS-REFERENCE TO RELATED APPLICATIONS

This present application is a divisional of co-pending U.S. Non-Provisional patent application Ser. No. 14/201,011, issued as U.S. Pat. No. 10,061,880, filed Mar. 7, 2014, entitled "MULTI AGENT RADIO FREQUENCY PROPAGATION SIMULATOR," and related to U.S. Non-Provisional Patent application Ser. No. 14/200,987, issued as U.S. Pat. No. 10,055,525, filed Mar. 7, 2014, entitled "MULTI AGENT RADIO FREQUENCY PROPAGATION SIMULATOR," the disclosures of which claim priority to the U.S. Provisional Patent Application Ser. No. 61/809,000, filed Apr. 5, 2013, entitled "MULTI AGENT RADIO FREQUENCY PROPAGATION SIMULATOR," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND AND SUMMARY OF THE INVENTION

The present invention relates to a multi agent radio frequency propagation simulator (MARPS), specifically used to determine performance of a radio frequency (RF) communications system prior to open air range (OAR) testing. A desirable interface between multi-agents is through 'over the air' RF connections which include not only the intended direct RF communications paths but also highly variable multi-ray propagation, range attenuation, external RF influences and near earth influence. These influences are all difficult to predict, control, and repeat in an outdoor environment. This outdoor testing, as has traditionally been done, is extremely expensive while simultaneously providing less data points than more controlled events, and the testing events are generally not repeatable. A need exists for an ability to interconnect multiple devices for laboratory simulation of this outdoor environment.

Currently in certain types of antenna design fields the correlation between model and simulations (M&S), hardware-in-the-loop (HITL) testing, and open air range testing has been minimal. The complexity of open air test ranges cannot be fully captured in modeling and simulation or in hardware-in-the-loop testing. Open air test ranges introduce many uncontrolled variables that not only affect the performance of an RF communications system but also impact the quality of the test data. An open air test is heavily influenced by a number of factors that other testing methods cannot completely account for, including: the ambient electromagnetic environment (EME) an RF system is operating in; the antenna placement, including the antenna's placement as compared to other antennas; the soil properties of the location being tested in; the physical terrain; the placement of the RF system within that terrain; multi-ray reflection signals; desirable signals; undesirable signals propagating in the area; hostile signals that might be trying to disrupts the RF systems functionality; general system variability; and other factors.

In open air test ranges the multiplicity of the before mentioned variables impact the quality of the data gathered from an open air test. Thus, it is difficult to determine cause and effect from open air testing because of the many variables introduced by the environment that cannot be completely accounted for with other testing methods. Furthermore, the results of the open air test are not repeatable, and the phenomenology is not clear.

Thus, a need exists to reproduce open-air near-earth effects in a lab and thereby be able to more fully utilize OAR testing. To further reproduce open-air near-earth effects a testing system needs to account for all donating competition to units under test as well as lab equipment to simulate the same. Also, a need exists to simulate an operational event with vehicle movement and controlled RF effects. Another need is to be able to reproduce the scalar effects with all of the variables for a given electromagnetic spectrum activity. Another need includes creation of a HITL laboratory environment for use in developmental test (DT) and operation test (OT) assessments as well as be able to take predictions for scalar effects from M&S and rapidly transition them into a HITL environment for validation. Another need is a requirement to converge results from M&S and OAR testing. MARPS improves RF system designs, reduces the OAR testing time, saves money in the development of future RF system technology, improves the correlation between models and system performance, increases test repeatability of real environments, and increases the ability to test new real-world complications that the RF system encounters. MARPS addresses these needs by a variety of result/effects including simulating an OAR test scenario in a laboratory using a computer, other RF equipment, and a set of digitally controlled RF paths.

An RF system being tested and used does not need modifications because the RF signals are modified by an exemplary aspect of a MARPS system rather than by modifying the generating RF devices themselves. For example, an exemplary MARPS system could be used to test a cell phone system in the presence of interfering signals where the cell phone being tested is directly plugged into the MARPS system and the interfering devices are also directly plugged into the MARPS system. Relative signal strengths are modified, not by physically moving the RF devices or by changing the signals by adjusting the generating RF device, but instead by manipulating the MARPS system paths to simulate such interactions. As a cell phone moves through an environment, signal strength of the cell phone will vary based on a multitude of variables including obstructions, other signals present, and even ground effects. A MARPS system can help create a more reliable cell phone or cell phone system by providing reproducible tests to developers without incurring the great expense of open air testing. Other examples of uses for a MARPS system would be in designing more robust police scanners, garage door openers, and other RF systems.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE INVENTION

The embodiments of the invention described herein are not intended to be exhaustive or to limit the invention to precise forms disclosed. Rather, the embodiments selected for description have been chosen to enable one skilled in the art to practice the invention.

Figure 1:
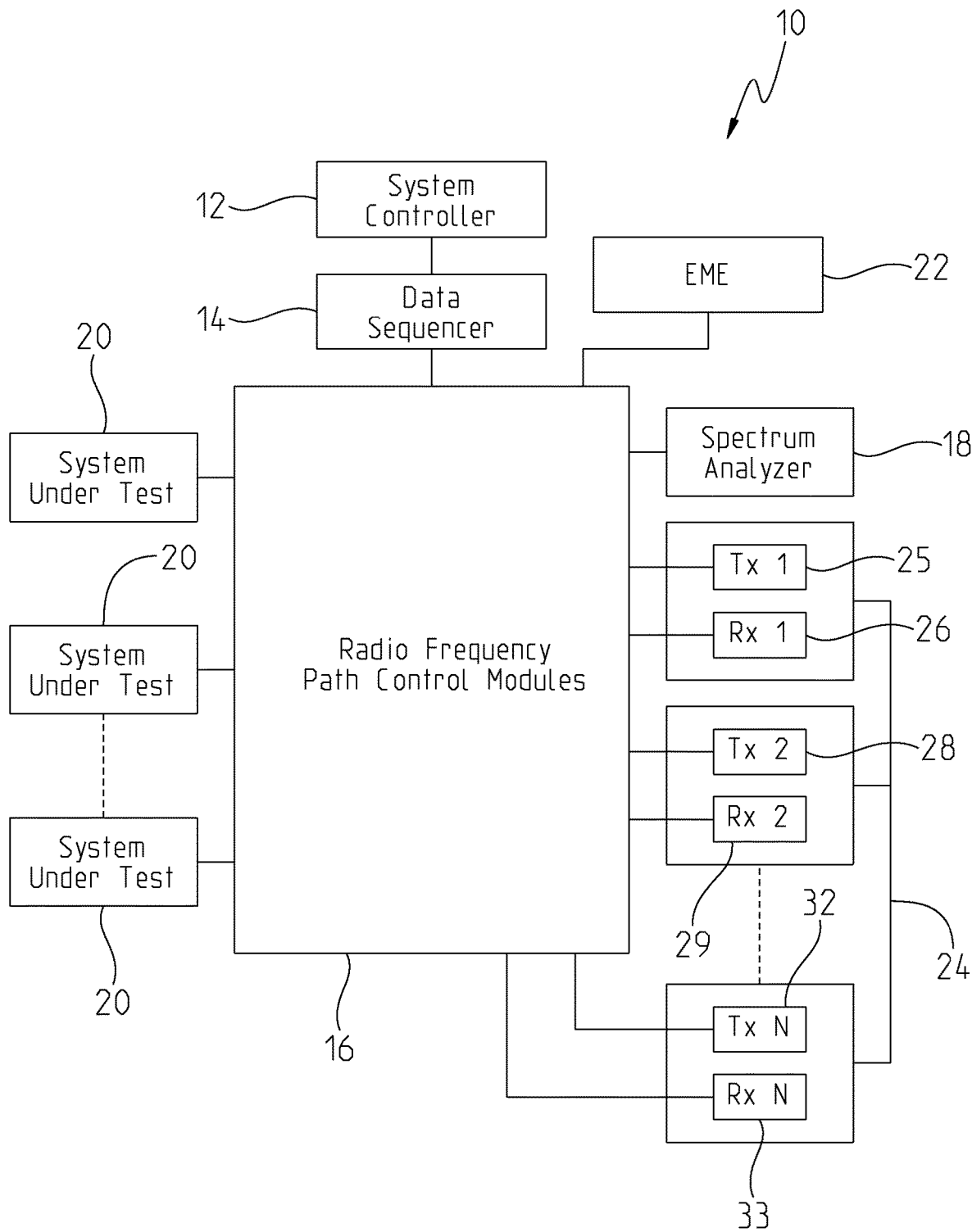
FIG. 1 is a block diagram of a RF propagation path simulator according to an illustrative embodiment of the disclosure.

FIG. 1 shows a high-level block diagram of a path simulator 10 in accordance with one embodiment of the invention. Path simulator 10 can be a scalable port system that simulates RF paths that exist in a real-world environment. Exemplary path simulator 10 comprises a system controller 12, a data sequencer 14, a plurality of RF path control modules 16, a spectrum analyzer 18, one or more SOIs 20, an EME generator 22, and one or more device pairs 24. A SOI in this embodiment can be a source of interference (SUT) or focus which generates interference between a receiver and transmitter or other elements in the EME.

Both exemplary device pairs 24 and SOIs 20 are meant to send and receive RF signals. An example device pair 24 is made up of a device pair transmitter 25 (Tx) and a device pair receiver 26 (Rx). SOIs 20 send and receive RF signals from all other RF devices connected to path simulator 10 but device pairs 24 only send and receive signals to and from SOIs 20 and not from other RF systems connected to path simulator 10. In this case, signals of exemplary device pairs 24 do not interact with other signals from other device pairs 24 because of the complexity of path simulator 10 increases exponentially with each added device pair 24 or SOI 20 and RF signals from a device pair 24 have little or no effect on any other device pair 24 connected to path simulator 10. The number of paths to be simulated by path simulator 10 can be reduced by orders of magnitude by not allowing RF signals from device pairs 24 to interact with other device pairs 24.

A SOI 20 receives signals from all other SOIs 20, from all device pairs 24, and from EME generator 22 because SOIs 20 can be devices that path simulator 10 is exhaustively testing.

Exemplary data sequencer 14 is a high-speed data input/output device that permits a synchronous transfer of large data set from the RF path control modules 16 and other RF devices connected to path simulator 10. Data sequencer 14 receives instructions to simulate propagation paths between different RF devices. These instructions can include time-stamped attenuator values, trigger timings, desired power on target values, and other commands. During an execution of an exemplary full simulation, path simulator 10 is completely controlled by data sequencer 14 in order to achieve consistent and reproducible results from the simulation. In this embodiment, system controller's 12 clock-rate cannot be relied upon to be completely consistent because of disturbances that can be caused by running a multiplicity of processes at any given time. One embodiment's system controller 12 can generally be some type of multi-purpose computer that can run on systems such as, for example, LabView®. Consequently, exemplary data sequencer 14 can operate with an independent clock-rate that allows the scenario to be executed with timing accuracy substantially better than other operating systems could provide. Before an exemplary full simulation is run, hardware control information is passed from system controller 12 to data sequencer 14. During an exemplary full simulation, data sequencer 14 synchronously changes propagation path values, by digitally controlling attenuators, at a fixed rate. Once an exemplary full simulation is complete, results data is transferred from data sequencer 14 to system controller 12 for analysis and possible processing. Data sequencer 14 can be an Agilent® 34980A multifunction mainframe.

EME 22 simulates RF background noise that might be detected by SOIs 20. Background RF noise can include television station transmissions, radio station transmission, garage door opener signals, and other RF signals that exist in a real-world environment. Different locations have different EME signatures and EME 22 simulates the background signatures that can be seen by SOIs 20.

Spectrum analyzer 18 can be an analysis port that is used for troubleshooting. Spectrum analyzer 18 can create a visual representation of power levels of one or more propagation paths of interest. Furthermore, a spectrum analyzer 18 can be connected at nearly every location of interest in a path simulator 10.

RF path control modules 16 form various RF paths between one or more SOIs 20 and other RF devices such as Tx 1 25, Rx 1 26, Tx 2 28, Rx 2 29, Tx N 32, and Rx N 33. RF path control modules 16 may comprise a combination of RF splitters and combiners, RF amplifiers, and adjustable RF attenuators arranged to create individually controlled paths between SOIs 20 and other RF devices connected to path simulator 10. Paths created by RF path control modules 16 can simulate real RF paths that can be seen by a SOI 20. RF path control modules 16 can be designed to be modular, interchangeable, and independent from each other to allow path simulator 10 to be expandable. RF path control modules 16 are building blocks that can be rearranged to simulate any number RF paths between SOIs 20 and the other RF devices connected to path simulator 10.

Figure 2:
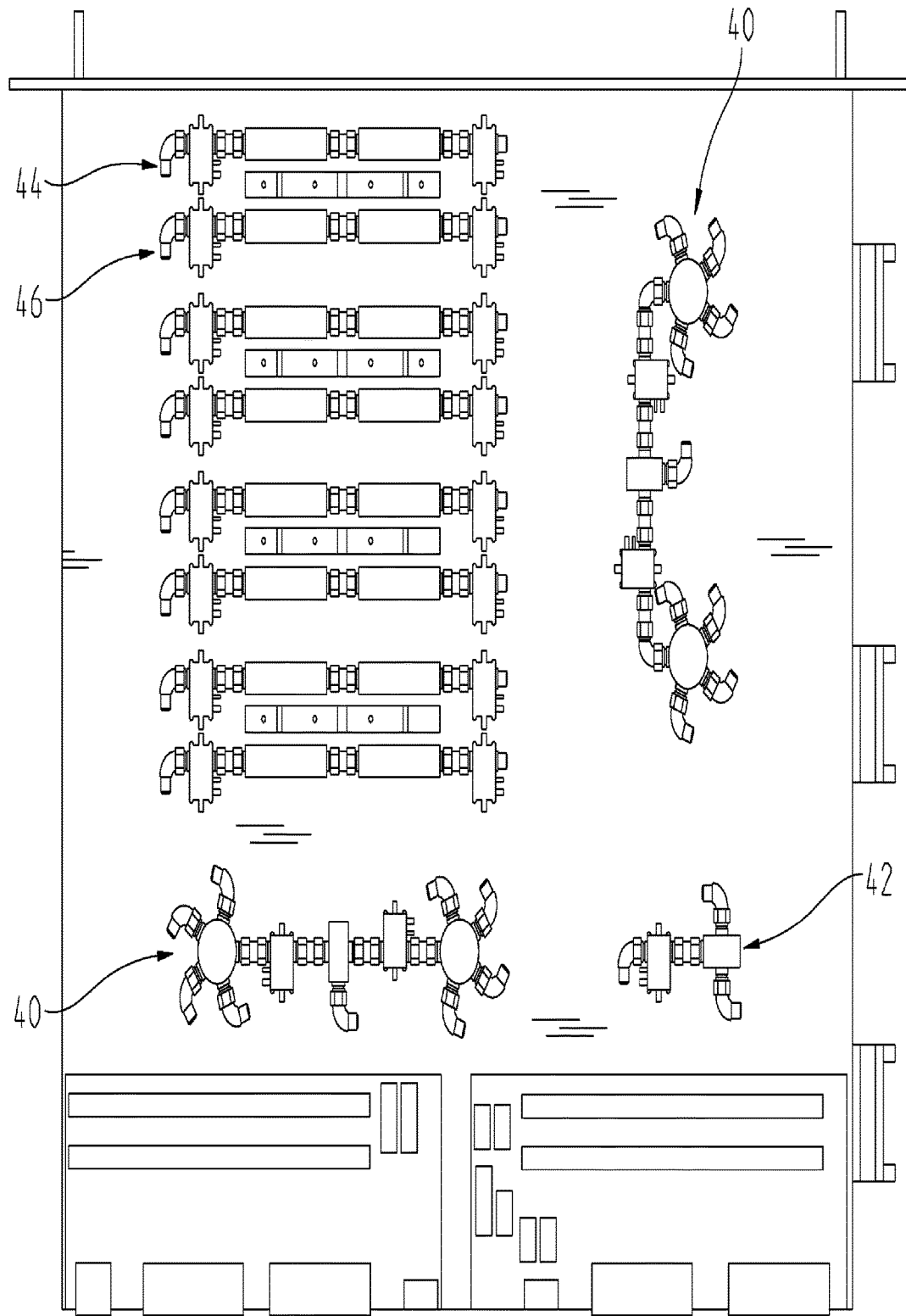
FIG. 2 is a diagram of propagation paths of a RF propagation path simulator according to an illustrative embodiment of the disclosure.

FIG. 2 shows a possible configuration of RF path control modules 16 in a path simulator 10. SOI paths 40, EME path 42, transmitter device pair paths 44, and receiver device pair paths 46 comprise a possible configuration of RF path control modules 16. Each exemplary RF path control module 16, regardless of its type, terminates in a coaxial connection that allows easy adjustment of the hardware of path simulator 10. Coax cables can be used to connect various RF path control modules 16 together in various combinations. Furthermore, additional RF components devices such as RF attenuators and RF amplifiers can be connected to RF path control modules 16 to ensure that the combination of propagation paths works correctly. For example, attenuators and amplifiers might be connected to an end of a RF path control module to increase reverse isolation or ensure impendence matching for connected transmission lines.

Figure 3:
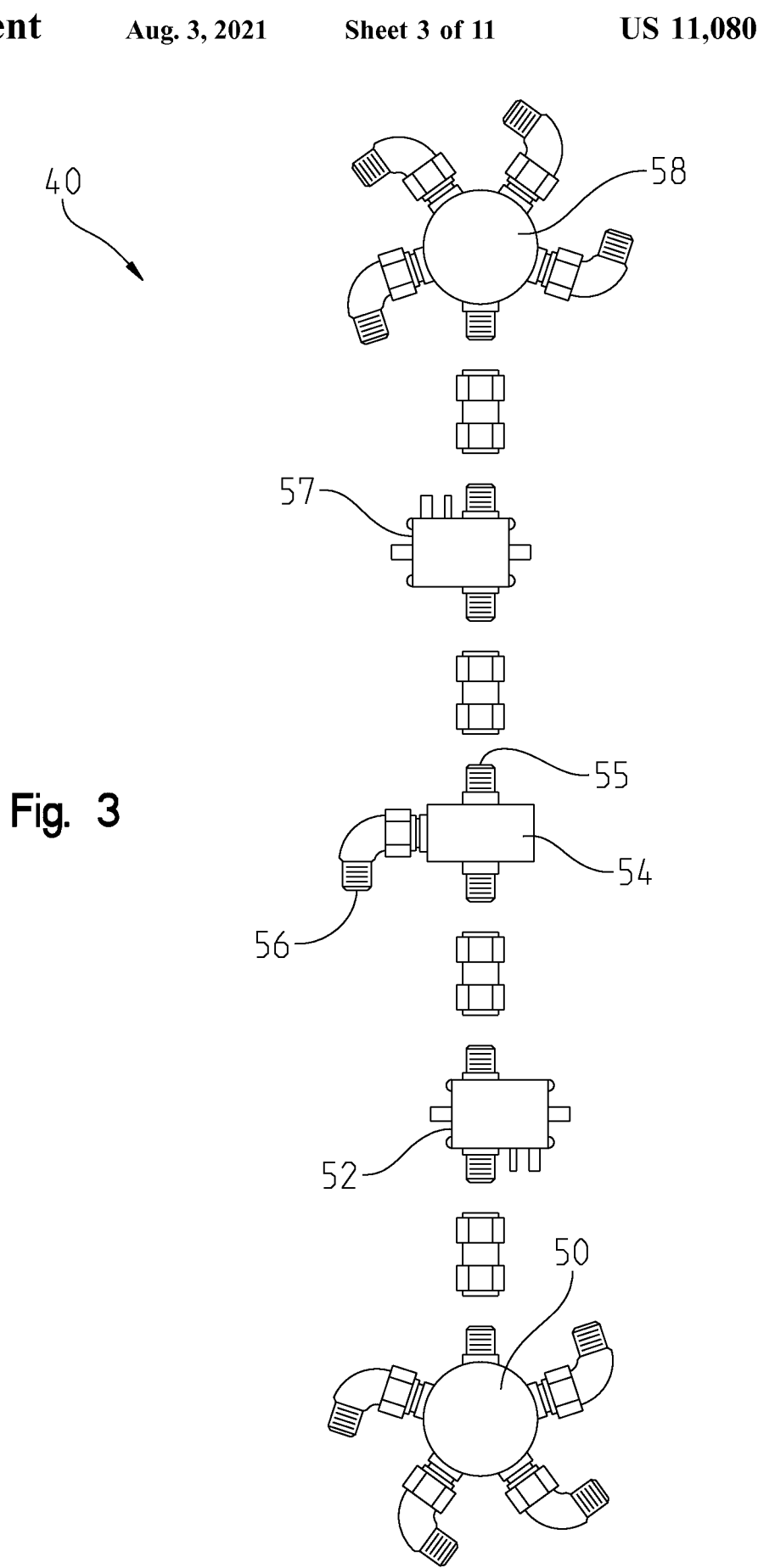
FIG. 3 is a diagram of a source of interference (SoI) RF propagation path according to an illustrative embodiment of the disclosure.

FIG. 3 shows a possible configuration of a SOI path 40. At one end of SOI path 40 is 4-way power divider 50. 4-way power divider 50 aggregates a plurality of RF signals either being received by a SOI 20 or being transmitted by a SOI 20. A 4-way power divider can be an Aeroflex Weinschel® model 1550A or model 1594 4-way resistive power divider. Connected to 4-way power divider 50 is an amplifier 52. With power dividers there can be an insertion loss associated with the combining and dividing of RF signals. Amplifier 52 boosts signals going to and from 4-way power divider 50 to keep the signal strength at proper and desired level. End 56 of a 2-way power divider 54 connects a SOI 20 to amplifier 52 and another amplifier 57 is connected at end 55 of the 2-way power divider 54. Also connected to amplifier 57 is a 4-way power divider 58. Amplifier 57 and 4-way power divider 58 are adapted to account for insertion loss and to divide and combine the RF signals. SOI path 40 is a modular and generic propagation path that can be modified, reproduced, expanded, and moved as desired. This embodiment of SOI path 40 can only connect to eight separate RF signals but certainly such a modular system can be adjusted to allow SOI 20 to connect to more RF signals. For example, 2-way power divider 54 can be replaced by a 4-way power divider, effectively doubling the number RF signals SOI 20 can interact with.

Figure 4:
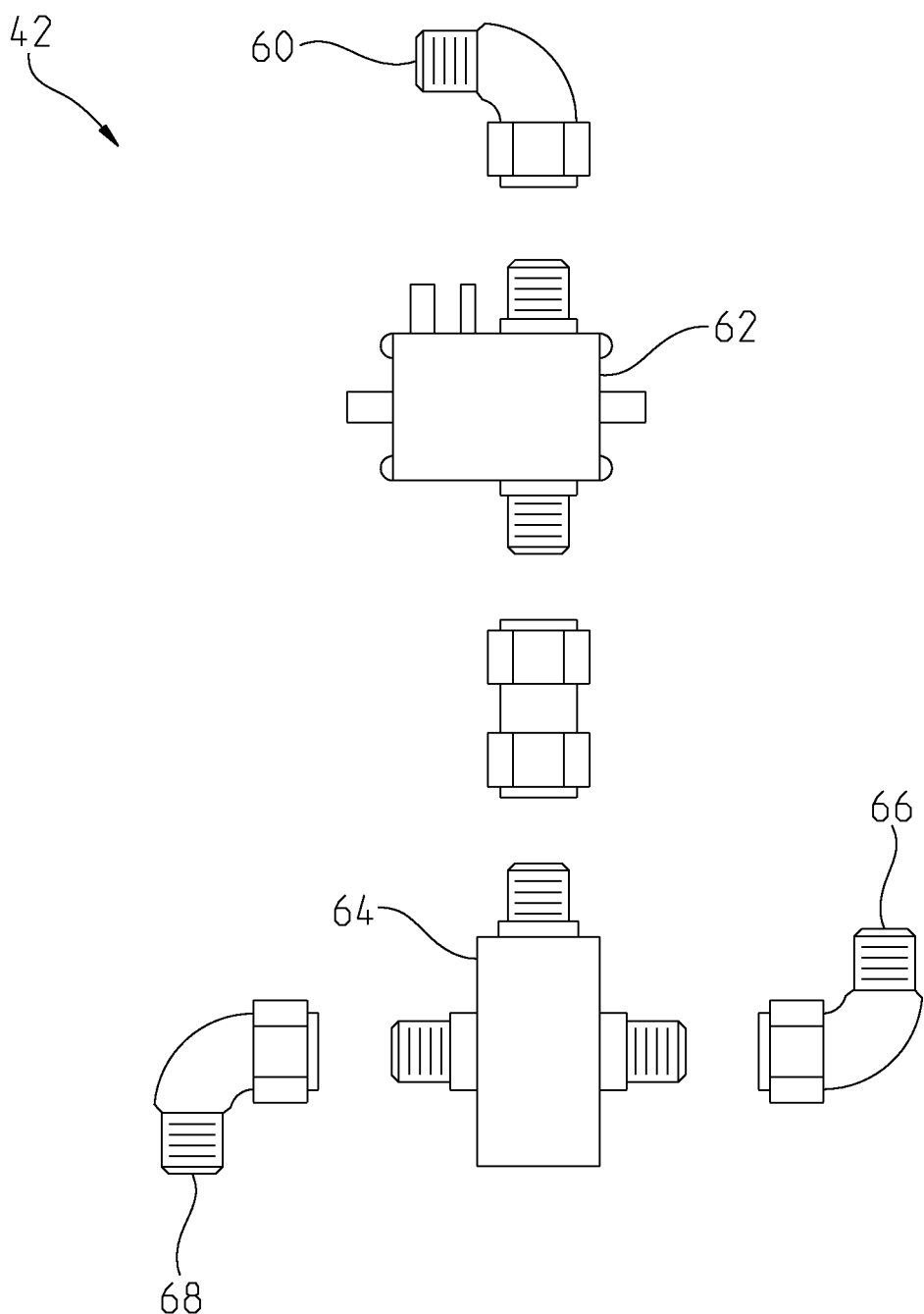
FIG. 4 is a diagram of an EME RF propagation path according to an illustrative embodiment of the disclosure.

FIG. 4 shows a possible configuration of an EME path 42. EME generator 22 connects to end 60 of EME path 42. Amplifier 62 then boosts the EME signal to compensate for insertion losses resulting from dividing the EME signal with 2-way power divider 64. In this embodiment of the invention, EME path 42 is connectible to two different SOIs 20 through end 66 and end 68. EME path 42 is easily expandable to be connectible to more SOIs 20 or other RF devices as desired.

Figure 5:
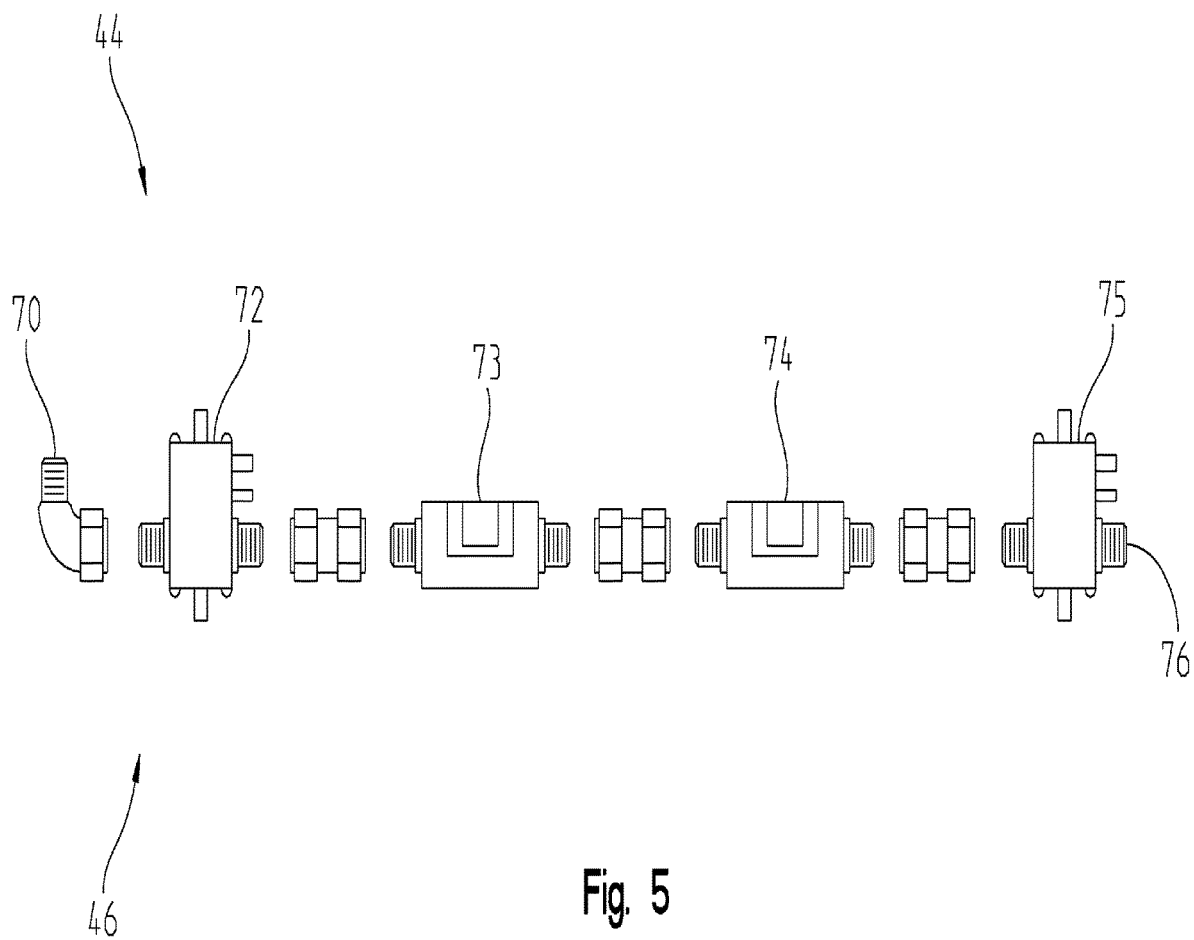
FIG. 5 is a diagram of a transmitter/receiver device pair RF propagation path according to an illustrative embodiment of the disclosure.

FIG. 5 shows a possible configuration of a transmitter device pair path 44 or a receiver device pair path 46. End 70 of transmitter device pair path 44 is configured to connect to a transmitting device. An amplifier 72 then boosts a signal from the transmitting device. Next, attenuator 73 and attenuator 74 adjust a signal to a desired level. Attenuator 73 and attenuator 74 are adapted to be digitally controllable by data sequencer 14 during a simulation to ensure that a signal mimics a desired RF signal. Finally, an amplifier 75 boosts a signal to account for losses in the connections between paths before transmitter device pair path 44 terminates at end 76. End 76 is adapted to connect to a SOI path 40. In an embodiment of the invention, the architecture for a receiver device pair path 46 is substantially similar to the architecture of transmitter device pair path 44 except that end 70 is configured to connect to a receiving device.

When combining multiple RF path control modules 16 into a path simulator 10, RF path control modules 16 should be isolated from each other such that the operation of one RF path control module 16 does not interfere with the operation of another RF path control module 16. Two key parameters in the exemplary design of the path simulator 10 are sneak paths between RF path control modules 16 and power on target.

Sneak paths are unexpected paths from any point in path simulator 10 to any other point in path simulator 10. Reverse isolation is used by the circuitry of path simulator 10 to restrict how much RF energy can proceed down an RF path in an undesired direction. Amplifiers not only amplify signals to compensate for losses in path simulator 10 they can also to implement reverse isolation by attenuating signals passing from the output port of an attenuator towards the input port of an attenuator. The attenuation of signals presented to an output port of an attenuator creates a form of reverse isolation. In addition to trying to prevent sneak paths from forming by going down the wrong RF path control modules 16, other sneak paths must be carefully monitored and controlled to prevent RF coupling between paths that reduce the fidelity of the data output from path simulator 10.

Power-on-target is another consideration when combining multiple RF path control modules 16 into a path simulator 10. Power-on-target is the amount of RF energy either a SOI 20 or a device pair 24 receives from any of the other SOIs 20 or device pairs 24. Since SOIs 20 can be located as close as a half meter away from each other, power-on-target can be a significant component of recreating high fidelity real world test because many of the RF systems being tested might see a large amount of power-on-target.

Figure 6:
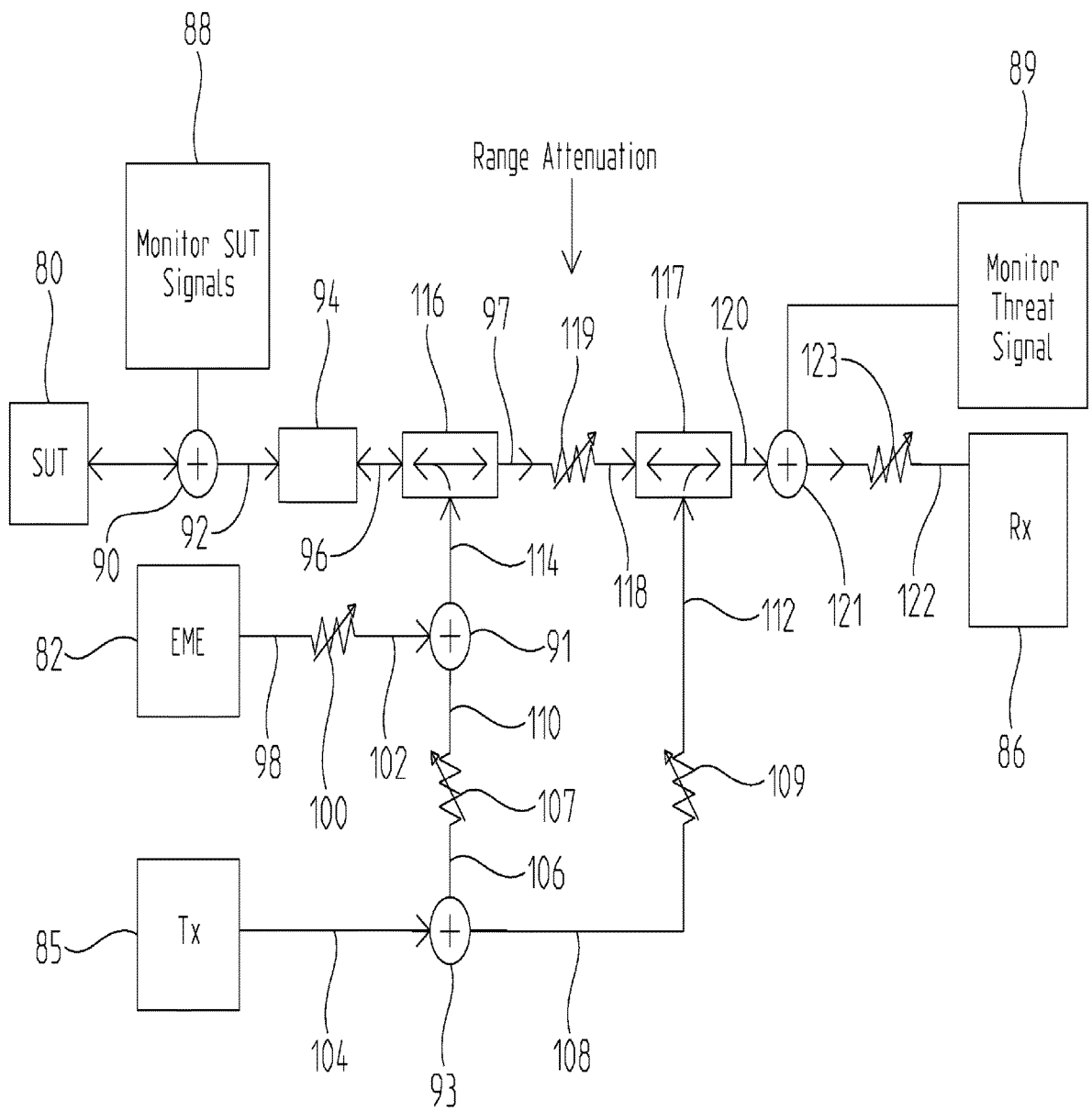
FIG. 6 is a diagram of an embodiment of a RF propagation path simulator according to an illustrative embodiment of the disclosure.

The embodiment of a path simulator 10 found in FIG. 6 is adapted to simulate RF propagation paths between a SOI 80, EME 82, a transmitter device pair 85, and a receiver device pair 86. Spectrum analyzer 88 and spectrum analyzer 89 can be placed at a number of locations in the hardware to monitor RF power levels and responses. SOI 80 is connected to a two-way power divider 90 that allows a spectrum analyzer 88 to monitor a SOI signal 92. A high-powered attenuator 94 can then attenuate SOI signal 92 creating SOI signal 96. Since SOI 80 can be a high-powered RF system, such as a jammer, and signals from such systems can burn-out components of path simulator 10, high-powered attenuator 94 is useful to reduce SOI signal 92 to protect components later in path simulator 10.

EME 82 generates EME signal 98 that is passed to attenuator 100 and becomes EME signal 102. Transmitter device pair 85 generates Tx signal 104 that is sent to a two-way power divider 93 that splits the signal into Tx signal 106 and Tx signal 108. Tx signal 106 passes through an attenuator 107 to become Tx signal 110 and Tx signal 108 pass through an attenuator 109 to become Tx signal 112. Two-way power divider 91 combines EME signal 102 and Tx signal 110 into interference signal 114, which is then passed to a directional coupler 116. Directional coupler 116 can send interference signal 114 to be seen by SOI 80 and it can combine SOI signal 96 and interference signal 114 to create SOI signal 97. Next, SOI signal 97 passes through an attenuator 119 and becomes SOI signal 118 and passes through another directional coupler 117. Directional coupler 117 combines SOI signal 118 with Tx signal 112 to become signal 120. Two-way power divider 121 allows spectrum analyzer 89 to monitor signal 120 before it passes through an attenuator 123 and becomes signal 122. Signal 122 is seen by receiver device pair 86.

Figure 7:
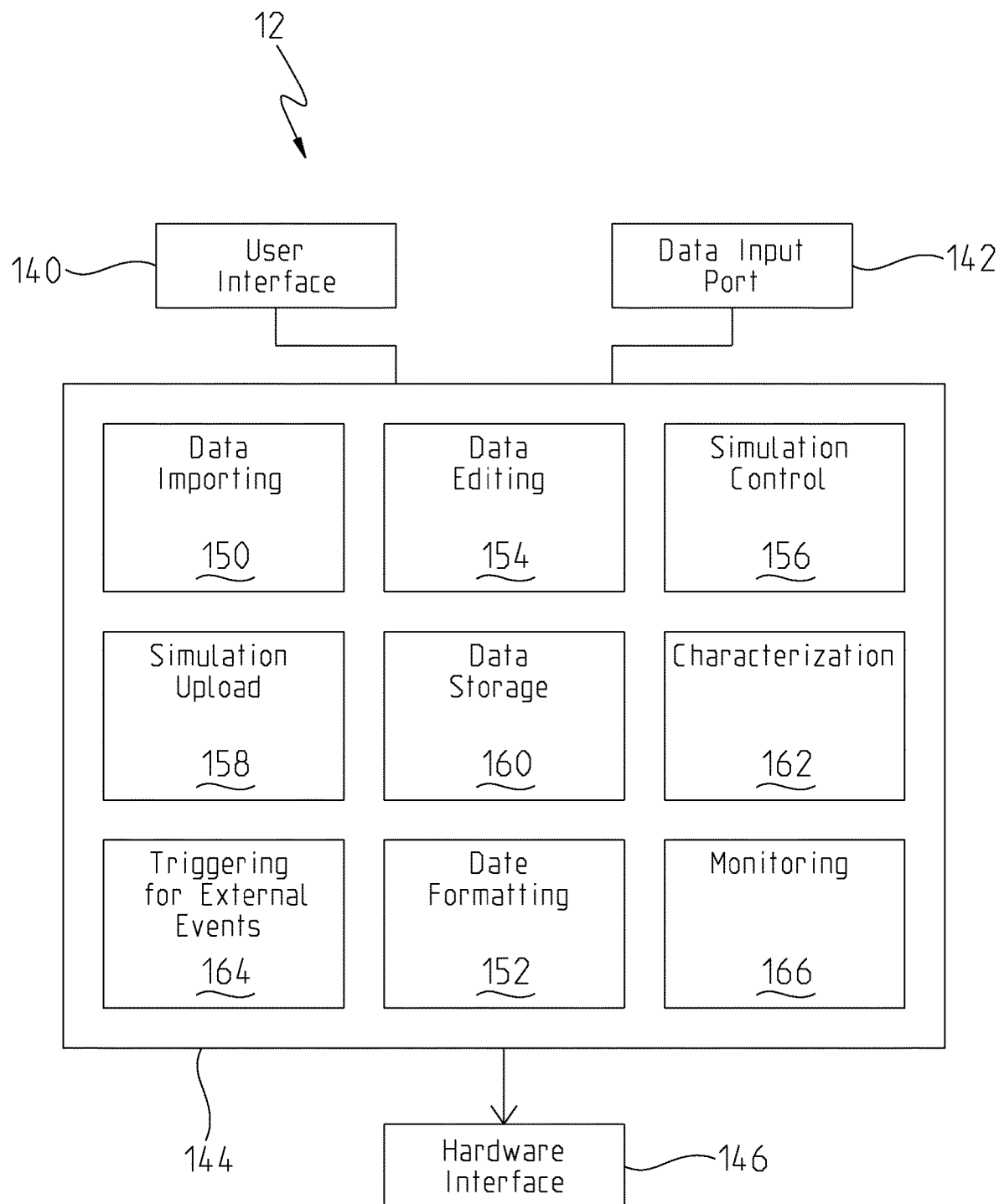
FIG. 7 is a conceptual diagram of what characteristics a control system has in an illustrative embodiment of the disclosure.

FIG. 7 shows a possible configuration for a system controller 12. System controller 12 is adapted to provide a user interface 140, a data input port 142, a control software package 144, and a hardware interface 146. In an embodiment of the invention, system controller 12 is a Microsoft Windows based computer capable of running National Instruments LabVIEW® 2011 program, with instrument communication and network access via an Ethernet connection, but certainly other designs of system controllers 12 are encompassed in the scope of the disclosure. User interface 140 can be a graphical user interface that can allow manual data entry and control of path simulator 10. User interface 140 can be further adapted to provide monitoring capabilities of path simulator's 10 operation of a simulation. Data input port 142 can be a USB connection, an optical drive, a keyboard, a floppy disc, a zip drive, or any other type of data transfer medium. Hardware interface 146 can be adapted to interface with a number of different types of hardware including a data sequencer 14, device pairs 24, spectrum analyzer 18, and any other RF device connected to path simulator 10.

Control software 144 serves as the user interface and control system for path simulator 10 and can have a number of characteristics. Control software 144 is adapted to accomplish data importing 150 and data formatting 152. The data importing 150 and data formatting 152 of large files of RF path data can be difficult. Input data is generally in the form of RF absolute power levels or power loss points coupled with timestamps and position data. Input data may also include timings for external device triggering and response data to allow for comparison with source data and positional analysis of response data. Input data may be measured RF data from some type real-world test, simulated data from modeling software, or it may be a mixture of simulated and actual test results. Often input data can exceed the memory capacity of associated hardware components, such as data sequencer 14, and therefore down-sampling may be required to match the data with the memory capabilities of path simulator hardware. Control software 144 can also calculate attenuator values from input RF data. When simulating a RF propagation path in path simulator 10 attenuator values are important and control software 144 can be adapted to calculate attenuator values from input data.

Control software 144 is further adapted to provide data editing 154. User interface 140 displays input simulation data, in a variety of formats, to a user and allows for a user to edit the data before and after running a simulation. Editing may be performed on discrete values, offsets, or fixed values of any propagation path.

Simulation control 156 is another characteristic of control software 144. A simulation may be run at real-time speed, at a different speed, or in a stepped mode. Simulation control 156 can allow an operator to trigger external RF devices and test equipment synchronously with the scenario playback, retrieve and display external device response data, and save and recall previously processed or edited scenario data. Simulation control 156 can also be preprogrammed where control software 144 runs an entire simulation without user interaction.

During an exemplary full simulation, path simulator 10 is controlled by a data sequencer 14, which operates independently of system controller 12. The control software 144 is adapted to upload 158 instructions for a full simulation to data sequencer 14 and other hardware prior to running a full simulation. Simulation upload 158 allows control software 144 to load a full simulation into data sequencer 14, begin execution, and later download the results from the full simulation.

Exemplary control software 144 provides data storage 160 for all types of data involved in running a simulation. Data storage 160 includes storing input data, storing reformatted input data, storing attenuator values, and storing results data. After a full simulation has been run control software 144 provides for storage and retrieval of full simulation and test result data. Data can include location data associated with different EME factors or signals including recorded data that includes recorded signals and associated location data within an EME. Data storage 160 maintains the input data's relationships between RF data, timestamps, and positional information established when the data originated. In an embodiment of the invention, the preferred stored data format is a tab-delimited file. A tab-delimited file allows for scenario adjustments and test result data post processing by external applications and tools. In an embodiment of the invention both the normalized and raw data file can be saved to allow for repeated execution of the saved scenario while the characterization data is valid. Saving the scenario also allows for updated characterizations and normalizations as needed.

Figure 8:
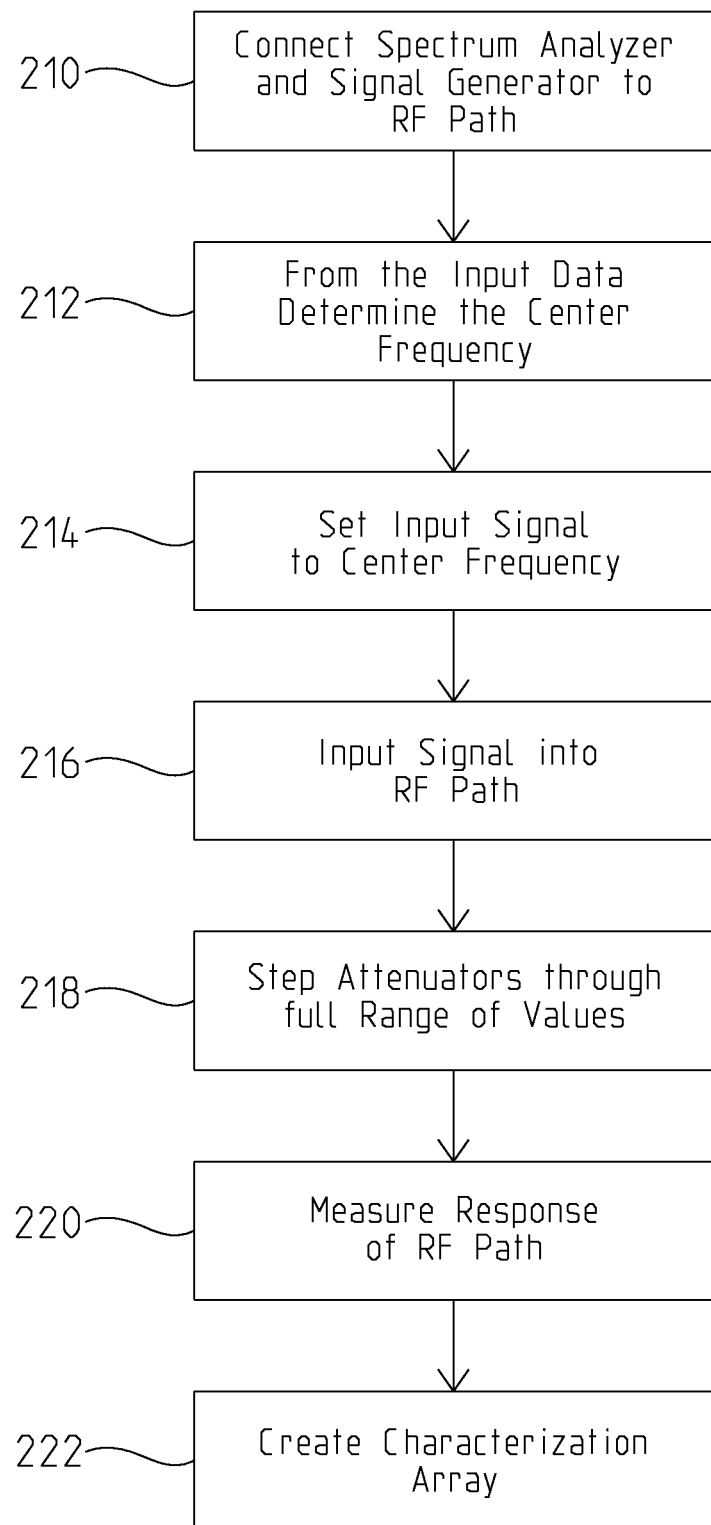
FIG. 8 is a block diagram of a method for characterizing RF propagation paths according to an illustrative embodiment of the disclosure.

Exemplary control software 144 uses input data to determine the RF propagation characteristics for each individual RF propagation path. Characterization 162 of RF propagation paths can be an important step in developing a simulation with high fidelity to a known RF signal because components can all react differently. Characterization 162 minimizes the discrepancies in a simulation caused by variation in hardware components of the path simulator 10. During characterization 162 the center frequency of operation for each RF path is calculated and the RF propagation properties for each path are measured. FIG. 8 shows steps to accomplishing characterization of a RF propagation path. Step 210 can be connecting a spectrum analyzer at one end of a RF path and a signal generator at another end of the RF path. Step 212 involves determining the center frequency of operation for the path RF path in question. Next, as in step 214, the signal generator is set to input the center frequency into the RF path. In step 216 the input signal is initiated. While the input signal is transmitting, attenuators in the RF path are stepped through their full range of values, as in step 218. Using a spectrum analyzer, the response of the RF path is measured in step 220. Finally, in step 222 a characterization array is created with all of the pertinent values to all of the RF propagation paths responses to the center frequency that will be used during a full simulation.

Referring back to FIG. 7, control software 144 also includes tools to trigger external devices as part of a simulation. Triggering events 164 may be assigned by time or be scenario steps, with delays and start and stop times also selectable. In an embodiment of the invention, triggers for all devices are independently programmed.

Furthermore, control software 144 monitors 166 response data from external devices, e.g., devices simulated by the EME system, captured during scenario execution and monitors 166 results from a simulation run on path simulator 10. Data from external devices, including devices simulated by the EME system, can be stored synchronously with test result data collected. Both trigger data and trigger response data is saved in control software 144 output file, along with the input timestamp and position data. Monitoring 166 of trigger response data and test result data provides valuable information regarding the SOIs being tested.

Figure 9:
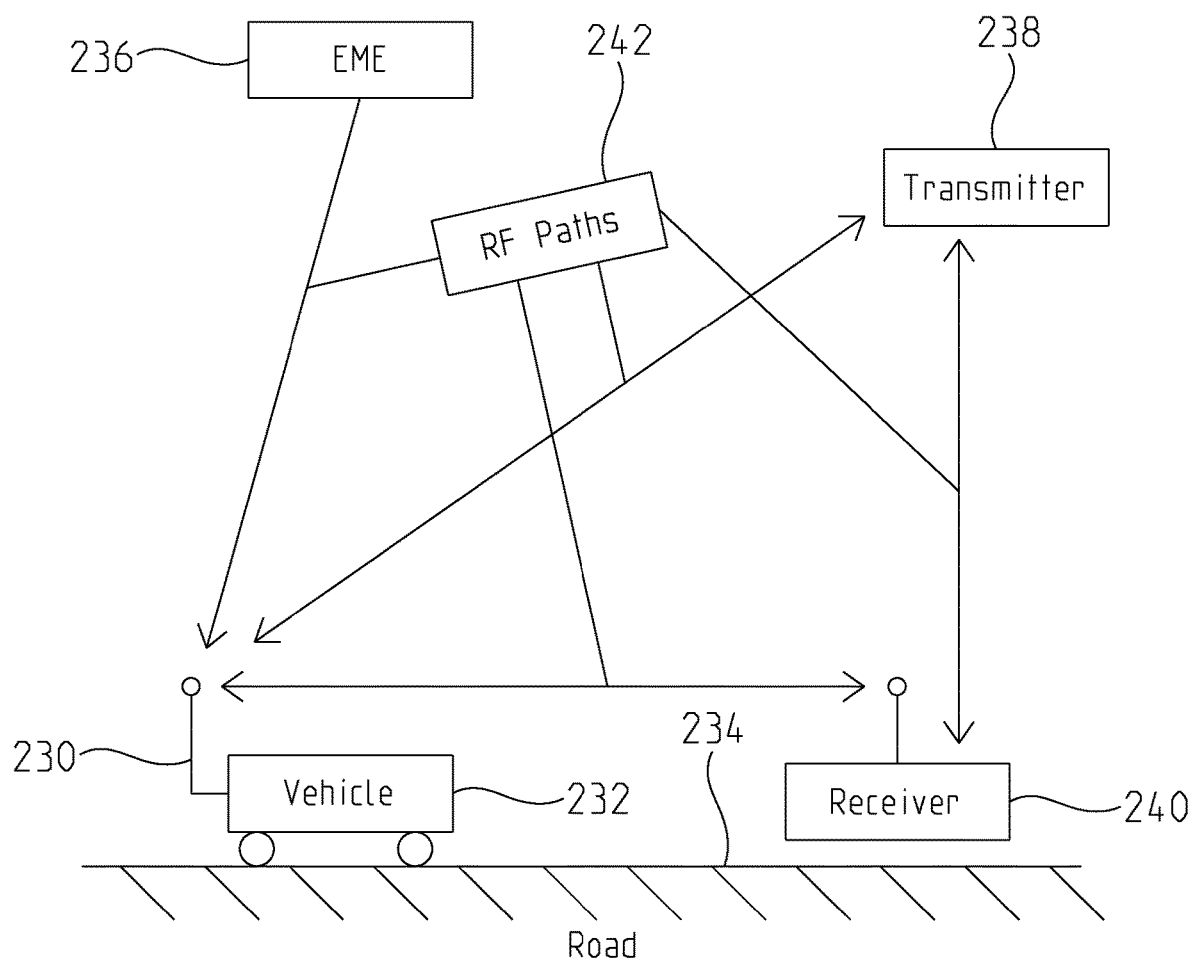
FIG. 9 is a diagram of data collection from an open air range test according to an illustrative embodiment of the disclosure.

In an exemplary embodiment of the invention, input data for path simulator 10 is collected from an OAR test. Generally, path simulator 10 is meant to simulate an OAR test in a laboratory through electrical hardware. Being able simulate an OAR test in a laboratory can reduce development costs by allowing researchers to test adjustments to equipment without going to the expense of a full OAR test. A full simulation is used to duplicate range test conditions for some type of RF system. Path simulator 10 can simulate conditions where the RF system in question can be fixed in its position or it can be moving within an EME that relates locations and recorded or specified EME signals, for example. For example, the RF system might be attached to a moving vehicle. FIG. 9 shows how an OAR test can be simulated using data collected from said OAR test. In a type of OAR test that path simulator can reproduce, SOI 230 is connected to vehicle 232 and vehicle 232 is moving down path 234. Contributing to what RF signals SOI 230 detects is EME emissions 236, a transmitter 238, and a receiver 240. To recreate this environment in a laboratory RF paths 242 are measured and stored with time-stamped information, and positional information attached. The data collected can become input data for path simulator 10, which can then use digitally controlled attenuators to recreate the RF paths 242 from the OAR test. During a simulation in path simulator 10, RF path attenuators can be controlled in such a way that the movement of the vehicle 232 and the RF paths' 242 relationships with the other RF signals can be recreated.

Figure 10:
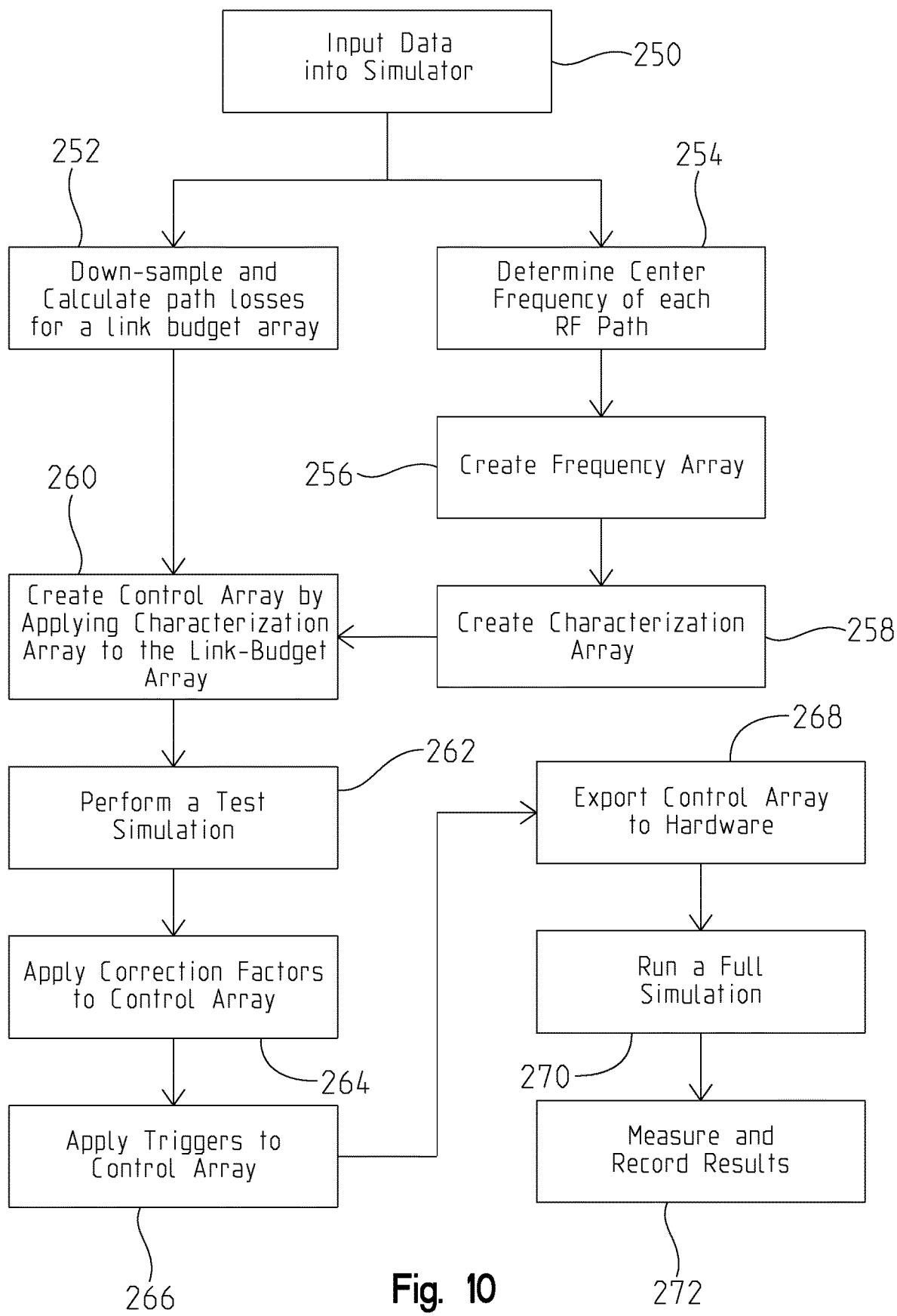
FIG. 10 is a block diagram of a method for implementing a simulation on a RF propagation path simulator according to one embodiment of the disclosure.

FIG. 10 shows a possible method for implementing a simulation using a path simulator 10. In step 250, input data is provided to path simulator 10. Path simulator input data includes a time-stamped list of measured or calculated RF received power measurements and associated geographical position data for all RF systems involved in a simulation. Input data can be a set of parameters detailing RF power propagation between all transmitting devices and all receiving devices used in a particular test scenario. Next, in step 252, the input data is down-sampled and a time-stamped list of calculated path loss values called a link budget array is created. Down-sampling can be necessary because system controller 12 and data sequencer 14 cannot always handle the amounts of data collected from an open air range test or from modeling and simulation software. In an embodiment of the invention, the link budget array is stored as an array of LabVIEW® clusters. A link budget array can have one element for each step of a full simulation, and values of each element of a link budget array are fixed values.

Using the input data, a center frequency of each RF propagation path that will be used in a simulation is determined in step 254. Next, a frequency array is created in step 256. A frequency array defines the center frequency of the signal that is to be simulated on each path. Next, in step 258 the frequency array is used to characterize each RF propagation path to be used in a simulation and create a characterization array. A characterization array is an array of values which are used to determine the actual path loss of each RF propagation path for all attenuator settings. The characterization array contains measured path loss/gain settings for all paths used in a simulation. In step 260, the characterization array is applied to the link budget array. In this process, the link budget path loss values are replaced with the nearest match from the characterization array, producing a control array, which is a normalized version of the link budget array. The control array contains values for RF propagation attenuators and other hardware that correct for imprecision in path simulator hardware and connections between test devices and path simulator hardware.

After a control array is prepared, a full simulation can be executed to verify correct RF propagation path reproduction, as seen in step 262. In the event that errors in received power and propagation path values occur, correction factors may be applied to the control array in step 264. Correction factors that have been applied can be saved for later use including use after new characterizations are applied to the control array.

Next, triggers are added to the control array in step 266. Triggers are used to activate a SOI, an external device, or external test equipment. Triggers may be specified by time or by step number in a scenario. The control array with triggers added is then uploaded to a data sequencer 14 in step 268 for the simulation to be executed in the hardware in step 270. Finally, in step 272 the results from a full simulation are measured and recorded to be used in later analysis.

Figure 11:
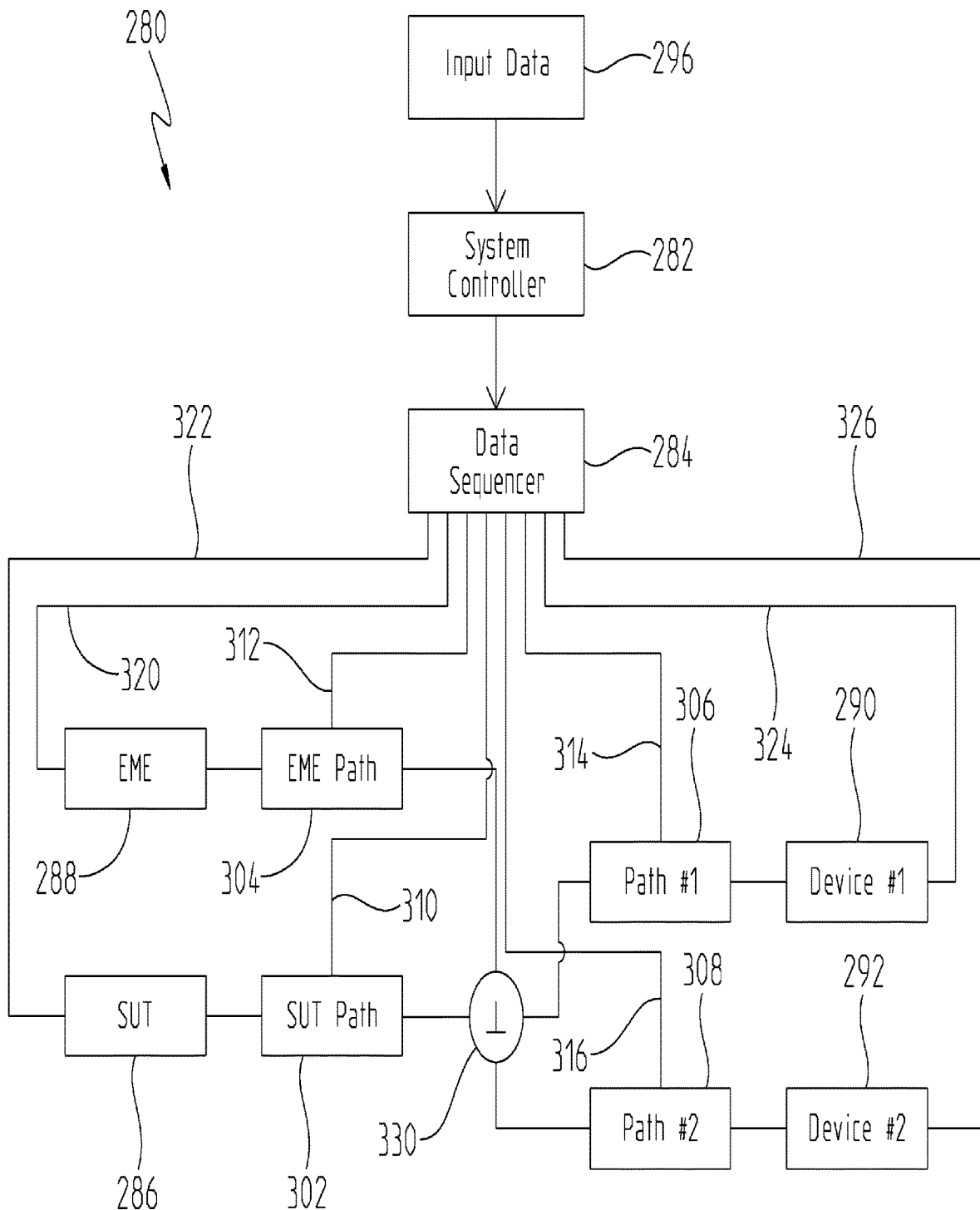
FIG. 11 is a diagram of a RF propagation path simulator according to an illustrative embodiment of the disclosure.

FIG. 11 shows another embodiment of a MARPS system 280 comprising a system controller 282, a data sequencer 284, a SOI 286, an EME generator 288, a first RF device 290, and a second RF device 292. The system controller 282 is adapted to receive input data 296 and then process said input data such that an output data set is created. Input data 296 can comprise measured power levels and losses of radio frequency signals measured during an OAR test or a modeling and simulation environment. Output data can comprise a modified set of the input data adapted to interface with attenuators and other electrical components in the MARPS system 280 used to simulate propagation paths and values for radio frequency signals. Data sequencer 284 is connected to system controller 282 and is adapted to receive said output data from system controller 282. Data sequencer 284 then translates the output data from system controller 282 into a first, a second, a third, and fourth plurality of path instructions, and a first, a second, a third, and a fourth plurality of device trigger instructions.

MARPS system 280 found in FIG. 11 further comprises a SOI path 302, an EME path 304, a first device path 306, and a second device path 308. SOI path 302 can be connected to the SOI 286 and to a power divider/combiner 330. Connecting SOI path 302 to data sequencer 284 is a first path connection 310 which relays the first plurality of path instructions from data sequencer 384 to SOI path 302 to modify the attenuator values of SOI path 302 and thereby modify a SOI signal to a desired level. EME path 304 is connected to EME generator 288 and to power divider/combiner 330. Connecting EME path 304 to data sequencer 284 is a second path connection 312 that relays the second plurality of path instructions from data sequencer 384 to EME path 304. The second plurality of path instructions can modify the attenuator values of EME path 304 and thereby modify a background noise signal generated by EME generator 288. The modified background noise signal can be substantially similar to a measured background noise signal obtained from either an OAR test or modeling software. First device path 306 is connected to first RF device 290 and to power divider/combiner 330. Connecting first device path 306 to data sequencer 284 is a third path connection 314 which relays the third plurality of path instructions from data sequencer 384 to first device path 306. The third plurality of path instructions can be used to modify the attenuator values of first device path 306 and thereby modify a first device signal generated by a first RF device. The modification may be such that the first device signal is substantially similar to a measured first device signal obtained from either an open air range test or modeling software. Second device path 308 is connected to second RF device 292 and to power divider/combiner 330. Connecting second device path 308 to data sequencer 284 is a fourth path connection 316 which relays the fourth plurality of path instructions from data sequencer 384 to second device path 308 to modify the attenuator values of second device path 308. The modified attenuator values may further modify a second device signal generated by a second RF device such that the second device signal is substantially similar to a measured second device signal obtained from either an open air range test or modeling software.

A first trigger connection 322 connects SOI 286 to data sequencer 284, which relays the first plurality of device trigger instructions to SOI 286. A device trigger instruction includes commands about when the device is supposed to be powered on, transmitting, and when the device is supposed to power off. Through a combination of trigger commands and attenuator instructions a SOI's signal strength can be adjusted to the desired level. A second trigger connection 320 connects EME generator 288 to data sequencer 284 and relays the second plurality of device trigger instructions from data sequencer 284 to EME generator 288. A third trigger connection 324 connects first RF device 290 to data sequencer 284 and relays the third plurality of device trigger instructions from data sequencer 284 to first RF device 290. A fourth trigger connection 326 connects second RF device 292 to data sequencer 284 and relays the fourth plurality of device trigger instructions from data sequencer 284 to second RF device 292. The second, third and fourth trigger connections controls the respective connected RF device and in combination with attenuator instructions controls the signal strength of an RF signal being input into the MARPS system.

Although the invention has been described in detail with reference to certain preferred embodiments, variations and modifications exist within the spirit and scope of the invention as described and defined in the following claims.

The invention claimed is:

1. A multiple radio frequency path simulator method comprising:
    receiving a first dataset by a system controller that comprises a plurality of electromagnetic source signals generated from a recorded or specified electromagnetic signal environment, said first dataset further comprises signal characteristics associated with each of said plurality of electromagnetic source signals comprising frequency, measured power levels and losses of radio frequency signals, and distance between said each of said plurality of electromagnetic source signals and a receiver;
    generating a second dataset by the system controller that comprises a modified set of the first dataset adapted to interface with propagation path attenuators and other propagation path electrical components based on the first data set and a clock signal associated with a simulated movement of an antenna through a simulated electromagnetic environment;
    receiving said second dataset by a data sequencer portion;
    translating the second dataset into propagation path component signal inputs for said propagation path attenuators and other said propagation path electrical components by the data sequencer portion;
    connecting a plurality of said propagation path electrical components together by a plurality of path control modules adapted to receive said propagation path component signal inputs from the data sequencer portion; and
    simulating propagation paths comprising a plurality of propagation path input/output components by sending the propagation path component signal inputs to said propagation path attenuators and other propagation path electrical components and to a plurality of devices based in part on triggering instructions.

2. A multiple radio frequency path simulator method as in claim 1, further comprising connecting a plurality of data collection devices to the path control modules adapted to record signal characteristics during a simulation.

3. A multiple radio frequency path simulator method as in claim 1, further comprising connecting a system under test to a plurality of radio frequency devices the plurality of path control modules are adapted to connect with.

4. A multiple radio frequency path simulator method as in claim 1, further comprising receiving results data and processing said results data by the system controller.

5. A multiple radio frequency path simulator method as in claim 1, further comprising adapting the system controller to a user interface, wherein said user interface is adapted to display dataset values, results values, simulation states, and the user interface is further adapted to allow for modification of displayed values.

6. A multiple radio frequency path simulator method as in claim 1, further comprising down-sampling the second dataset from the first dataset.

7. A multiple radio frequency path simulator method as in claim 1, further comprising time-stamping second dataset attenuator values, trigger timings, and desired signal power levels for each individual signal being simulated.

8. A multiple radio frequency path simulator method as in claim 1, further comprising adapting the system controller to characterize each individual path control module using a reference signal and a spectrum analyzer and implementing characterization results from each path control module to produce the second dataset.

9. A multiple radio frequency path simulator method as in claim 1, further comprising configuring the data sequencer portion to synchronously transfer large datasets to and from the system controller and further configuring the data sequencer portion to synchronously transfer large datasets to and from the plurality of path control modules.

10. A multiple radio frequency path simulator method as in claim 1, further comprising adapting the data sequencer portion to operate using a clock-rate that is independent of the clock-rate of the system controller.

11. A multiple radio frequency path simulator method as in claim 1, further comprising implementing adjustable attenuators, power dividers and combiners, and power amplifiers into the path control modules' components.

12. A multiple radio frequency path simulator method as in claim 11, further comprising digitally controlling the adjustable attenuators, power dividers and combiners, and power amplifiers connected to the data sequencer portion and receiving commands from said data sequencer portion in order to adjust a signal that is passing through a path control module.

13. A multiple radio frequency path simulator method comprising:
    receiving a first dataset by a system controller that comprises a plurality of electromagnetic source signals within a recorded or specified electromagnetic signal environment, said first dataset further comprises signal characteristics associated with each of said plurality of source signals comprising frequency, measured power levels and losses of radio frequency signals, and distance between said plurality of electromagnetic source signals and a receiver;
    generating a second dataset by the system controller that comprises a modified set of the first dataset adapted to interface with propagation path attenuators and other propagation path electrical components based on the first data set and a clock signal associated with a simulated movement of an antenna through a simulated electromagnetic environment;

receiving said second dataset by a data sequencer portion;
translating the second dataset into propagation path component signal inputs for said propagation path attenuators and other said propagation path electrical components by the data sequencer portion;
connecting a plurality of said propagation path electrical components together by a plurality of path control modules adapted to receive said propagation path component signal inputs from the data sequencer portion;
connecting a plurality of data collection devices to the path control modules adapted to record signal characteristics during a simulation;
connecting a system under test to a plurality of radio frequency devices that the plurality of path control modules are adapted to connect with;
receiving results data and processing said results data by the system controller;
adapting the system controller to a user interface, wherein said user interface is adapted to display dataset values, results values, simulation states, and the user interface is further adapted to allow for modification of displayed values;
down-sampling the second dataset from the first dataset;
time-stamping the second dataset attenuator values, trigger timings, and desired signal power levels for each individual signal being simulated;
adapting the system controller to characterize each individual path control module using a reference signal and a spectrum analyzer and implementing characterization results from each path control module to produce the second dataset;
configuring the data sequencer portion to synchronously transfer large datasets to and from the system controller and further configuring the data sequencer portion to synchronously transfer large datasets to and from the plurality of path control modules;
adapting the data sequencer portion to operate using a clock-rate that is independent of the clock-rate of the system controller;
implementing adjustable said propagation path attenuators, power dividers and combiners, and power amplifiers into the path control modules' components;
digitally controlling the adjustable attenuators connected to the data sequencer portion and receiving commands from said data sequencer portion in order to adjust a signal that is passing through a path control module; and
simulating propagation paths comprising a plurality of propagation path input/output components by sending the propagation path component signal inputs to said propagation path attenuators and other propagation path electrical components to at plurality of devices based in part on triggering instructions.

14. A multiple radio frequency path simulator method as in claim 1, further comprising connecting a plurality of data collection devices to path simulation segments adapted to record signal characteristics during a simulation including signal characteristics between said path simulation segments.

\* \* \* \* \*